United States Patent
Kim et al.

(10) Patent No.: US 12,460,113 B2
(45) Date of Patent: Nov. 4, 2025

(54) ADHESIVE COMPOSITION FOR DICING TAPE AND DICING TAPE INCLUDING THE SAME

(71) Applicant: LG CHEM, LTD., Seoul (KR)

(72) Inventors: Da Ae Kim, Daejeon (KR); Ji Ho Han, Daejeon (KR); Kwang Joo Lee, Daejeon (KR); Eun Yeong Kim, Daejeon (KR); Mi Jang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 289 days.

(21) Appl. No.: 17/599,208

(22) PCT Filed: Aug. 14, 2020

(86) PCT No.: PCT/KR2020/010901
§ 371 (c)(1),
(2) Date: Sep. 28, 2021

(87) PCT Pub. No.: WO2021/060707
PCT Pub. Date: Apr. 1, 2021

(65) Prior Publication Data
US 2022/0154053 A1 May 19, 2022

(30) Foreign Application Priority Data

Sep. 26, 2019 (KR) .................. 10-2019-0119120
Jul. 31, 2020 (KR) .................. 10-2020-0096316

(51) Int. Cl.
| C09J 133/08 | (2006.01) |
| C09J 7/24 | (2018.01) |
| C09J 7/38 | (2018.01) |
| H01L 21/683 | (2006.01) |

(52) U.S. Cl.
CPC ............. *C09J 133/08* (2013.01); *C09J 7/241* (2018.01); *C09J 7/385* (2018.01); *C09J 2203/326* (2013.01); *C09J 2423/006* (2013.01); *C09J 2433/00* (2013.01); *H01L 21/6836* (2013.01); *Y10T 428/2891* (2015.01)

(58) Field of Classification Search
None
See application file for complete search history.

(56) References Cited

U.S. PATENT DOCUMENTS

| 4,801,528 A * | 1/1989 | Bennett .................. C09J 4/00 433/9 |
| 9,761,476 B2 * | 9/2017 | Kim .................. C08L 63/00 |
| 10,324,260 B1 | 6/2019 | Evans et al. |
| 2008/0118764 A1 | 5/2008 | Shintani et al. |
| 2009/0004829 A1 * | 1/2009 | Saiki ............... H01L 21/6835 526/204 |
| 2010/0092772 A1 * | 4/2010 | Nishida .................. C09J 7/385 428/352 |
| 2013/0224425 A1 * | 8/2013 | Yamazaki ............. B32B 38/004 428/78 |
| 2016/0060489 A1 | 3/2016 | Kim et al. |

FOREIGN PATENT DOCUMENTS

| CN | 105264033 A | 1/2016 | |
| CN | 105295787 A | 2/2016 | |
| JP | 2008-103516 A | 5/2008 | |
| JP | 2009-079204 A | 4/2009 | |
| JP | 2015-005598 A | 1/2015 | |
| JP | 2017-508304 A | 3/2017 | |
| KR | 10-0894173 | 4/2009 | |
| KR | 10-2017-0015352 A | 2/2017 | |
| KR | 10-1722137 B | 3/2017 | |
| KR | 10-1878908 | 7/2018 | |
| WO | WO-2015102342 A1 * | 7/2015 | ............. C08L 63/00 |
| WO | 2019-084397 A1 | 5/2019 | |

OTHER PUBLICATIONS

Shimazaki, Yuta et al., Machine translation of JP 2009079204 A, Apr. 16, 2009 (Year: 2009).*
Donatas, Satas, "Handbook of Pressure Sensitive Adhesive Technology", 1999, Satas & Associates, 3rd edition, pp. 444-451 (Year: 1999).*
Yuta, Shimazaki et al., English translation of JP 2009-79204A, Apr. 16, 2009 (Year: 2009).*
Compound summary of "Triphenylphosphine", PubChem. Mar. 25, 2025 (Year: 2025).*
International Search Report issued for International Application No. PCT/KR2020/010901 on Nov. 26, 2020, 4 pages.

* cited by examiner

*Primary Examiner* — Anish P Desai
(74) *Attorney, Agent, or Firm* — ROTHWELL, FIGG, ERNST & MANBECK, P.C.

(57) ABSTRACT

The present invention provides an adhesive composition for a dicing tape, which may prevent the success rate of chip pick-up from decreasing due to an oxygen inhibition phenomenon occurring in a dicing process, and a dicing tape including the same. The adhesive composition for a dicing tape includes an adhesive binder, a reducing agent, and a photoinitiator.

20 Claims, No Drawings

ADHESIVE COMPOSITION FOR DICING TAPE AND DICING TAPE INCLUDING THE SAME

CROSS-REFERENCE TO RELATED APPLICATION(S)

This application is a 35 U.S.C. 371 National Phase Entry Application from PCT/KR2020/010901, filed on Aug. 14, 2020 and designating the United States, which claims priority to Korean Patent Application No. 10-2019-0119120, filed in the Korean Intellectual Property Office on Sep. 26, 2019 and Korean Patent Application No. 10-2020-0096316, filed in the Korean Intellectual Property Office on Jul. 31, 2020, each of the disclosures of which is incorporated herein by reference in its entirety.

BACKGROUND

1. Technical Field

The present invention relates to an adhesive composition for a dicing tape and a dicing tape including the same.

2. Background of the Invention

In general, semiconductor chip fabrication processes include a process of forming a fine pattern on a wafer and a process of polishing and packaging the wafer to meet the specifications of the final device.

The packaging process includes: a wafer inspection process of inspecting defects in a semiconductor chip; a dicing process of separating a wafer into individual chips by cutting; a die bonding process of attaching the individual chips to the mounting board of a circuit film or a lead frame; a wire bonding process of connecting a chip pad provided on the semiconductor chip to the circuit pattern of the circuit film or lead frame by electrical connecting means such as wire; a molding process of encapsulating the semiconductor chip with an encapsulation material to protect the internal circuit and other parts of the semiconductor chip; a trimming process of cutting a dam bar connecting leads; a forming process of bending the leads into a desired form; and a final product inspection process of inspecting defects in a packaged product.

In the dicing process, the wafer is cut to a predetermined thickness by a diamond wheel or the like. Before the dicing process, a dicing tape is laminated onto the backside of the wafer under suitable conditions to secure the wafer, and then the dicing process is performed. In addition, a die bonding film (adhesive film) is used to attach the diced individual chips to a circuit board. Through the dicing process, separate individual chips are produced from the semiconductor wafer having a plurality of chips formed therein. In a broad sense, the dicing process is a process of producing a plurality of separate individual chips by grinding the backside of a semiconductor wafer and cutting the semiconductor wafer along a dicing line between the chips.

In addition, in a conventional cutting process, there is a problem that the yield is lowered due to damage to the chip. To solve this problem, a fabrication process including an expanding process which is performed after cutting a semiconductor chip with a blade has been suggested. In this fabrication process, the cut semiconductor wafer is expanded, the base film of the semiconductor wafer is irradiated with ultraviolet (UV) light, and a plurality of individual chips is picked up.

However, during the expanding process, a die-lift phenomenon occurs in which the periphery of the cut chip is lifted, and oxygen is trapped in the lifted portion. Thereafter, a radical generated in the process of irradiating UV light reacts with the trapped oxygen to form a peroxyl radical, and thus an oxygen inhibition phenomenon occurs at the periphery of the chip. The surface where the oxygen inhibition phenomenon has occurred remains having high adhesion, and when the chips are picked up, a problem arises in that the success rate of pick-up of chips is decreased due to fixation between of the film.

BRIEF SUMMARY OF THE INVENTION

An object of the present invention is to provide an adhesive composition for a dicing tape capable of preventing the success rate of chip pick-up from being decreased by the oxygen inhibition phenomenon occurring in the dicing process, and a dicing tape including the adhesive composition for a dicing tape.

However, objects which are to be achieved by the present invention are not limited to the above-mentioned object, and other objects which are not mentioned will be clearly understood by those skilled in the art from the following description.

One embodiment of the present invention provides an adhesive composition for a dicing tape including: an adhesive binder; a reducing agent; and a photoinitiator.

Another embodiment of the present invention provides a dicing tape including: a base film; and an adhesive layer formed on at least one surface of the base film, wherein the adhesive layer includes the adhesive composition for a dicing tape.

DETAILED DESCRIPTION OF THE INVENTION

The terms used in the present specification and the appended claims should not be interpreted as being limited to general meanings or dictionary definitions, but should be interpreted as having meanings and concepts relevant to the technical scope of the present invention, based on the principle according to which the inventors can appropriately define the meaning of the terms to describe their invention in the best manner.

Accordingly, it should be understood that the embodiments described in the present specification are merely the most preferred example of the present invention, but do not cover all the technical spirits of the present invention, and thus there may be various equivalents and modifications capable of replacing them at the time of filing of the present invention.

Throughout the present specification, it is to be understood that when any part is referred to as "including" any component, it does not exclude other components, but may further include other components, unless otherwise specified.

Throughout the present specification, when any member is referred to as being "on" another member, it not only refers to a case where any member is in contact with another member, but also a case where a third member exists between the two members.

Throughout the present specification, the unit "parts by weight" may refer to the ratio of weight between components.

Throughout the present specification, the term "(meth) acrylate" is used as a collective term for acrylate and methacrylate.

Throughout the present specification, the "weight-average molecular weight" and "number-average molecular weight" of any compound may be calculated using the molecular weight and molecular weight distribution of the compound. Specifically, the molecular weight and molecular weight distribution of the compound may be obtained by: placing tetrahydrofuran (THF) and the compound in a 1-ml glass vial to prepare a test sample in which the concentration of the compound is 1 wt %; filtering a standard sample (polystyrene) and the test sample through a filter (pore size: 0.45 µm); injecting each of the sample filtrates into a GPC injector; and comparing the elution time of the test sample with a calibration curve of the standard sample. At this time, Infinity II 1260 (Agilent Technologies, Inc.) may be used as a measurement instrument, and the flow rate and the column temperature may be set at 1.00 mL/min and 40.0° C., respectively.

Throughout the present specification, "glass transition temperature (Tg)" may be measured using differential scanning analysis (DSC). Specifically, the glass transition temperature may be measured using DSC (Differential Scanning calorimeter, DSCQ2000, TA Instrument Korea) by heating a sample within a temperature range of −60° C. to 150° C. at a heating rate of 5° C./min, performing a two-cycle experiment within the temperature range, and measuring the midpoint of the DSC curve plotted as the point where the amount of heat change is present.

In an expanding process of a conventional dicing process, a die-lift phenomenon occurs in which the periphery of a cut chip is lifted, and oxygen is trapped in the lifted portion. Thereafter, a radical generated in a process of irradiating ultraviolet (UV) light reacts with the trapped oxygen to form a peroxyl radical, and thus an oxygen inhibition phenomenon occurs at the periphery of the chip. The surface where the oxygen inhibition phenomenon has occurred remains having high adhesion, and when the chips are picked up, a problem arises in that the success rate of pick-up of chips is decreased due to fixation of the film.

One embodiment of the present invention provides an adhesive composition for a dicing tape including: an adhesive binder; a reducing agent; and a photoinitiator.

As the adhesive composition for a dicing tape according to the present invention further includes the reducing agent, it may mitigate the oxygen inhibition phenomenon by inducing the reduction of a peroxyl radical.

According to one embodiment of the present invention, the adhesive binder may include a (meth)acrylate-based resin having a glass transition temperature of −28° C. to −58° C., −29° C. to −57° C., −30° C. to −56° C., −30° C. to −55° C., −31° C. to −54° C., −32° C. to −53° C., −33° C. to −52° C., −34° C. to −51° C., or −35° C. to −50° C. When the adhesive binder is selected as described above, it is possible to control the adhesive force of the adhesive composition and to control the concentration of a peroxyl radical generated by the reaction of the trapped oxygen with a radical generated in an ultraviolet (UV) irradiation process.

According to one embodiment of the present invention, the (meth)acrylate-based resin may include a copolymer of a (meth)acrylic ester-based monomer and a crosslinkable functional group-containing monomer. As the (meth)acrylate-based resin includes the above-described copolymer, it is possible to realize the basic physical properties of the adhesive layer.

According to one embodiment of the present invention, the (meth)acrylic ester-based monomer may be alkyl(meth) acrylate. More specifically, the (meth)acrylic ester-based monomer may be one or a mixture of two or more of pentyl(meth)acrylate, n-butyl(meth)acrylate, ethyl(meth) acrylate, methyl(meth)acrylate, hexyl(meth)acrylate, n-octyl (meth)acrylate, isooctyl(meth)acrylate, 2-ethylhexyl(meth) acrylate, dodecyl(meth)acrylate, and decyl(meth)acrylate, which are monomers having an alkyl group containing 1 to 12 carbon atoms. As the (meth)acrylic ester-based monomer is selected from those described above, it is possible to realize the basic physical properties of the adhesive layer.

According to one embodiment of the present invention, the crosslinkable functional group-containing monomer may be one or a mixture of two or more of a hydroxyl group-containing monomer, a carboxyl group-containing monomer and a nitrogen-containing monomer. As the crosslinkable functional group-containing monomer is selected from those described above, it is possible to realize the basic physical properties of the adhesive layer.

According to one embodiment of the present invention, the hydroxyl group-containing monomer may be one selected from the group consisting of 2-hydroxyethyl(meth) acrylate, 2-hydroxypropyl(meth)acrylate, 4-hydroxybutyl (meth)acrylate, 6-hydroxyhexyl(meth)acrylate, 8-hydroxyoctyl(meth)acrylate, 2-hydroxyethylene glycol (meth) acrylate, 2-hydroxypropylene glycol (meth)acrylate, and combinations thereof. As the hydroxyl group-containing monomer is selected from those descried above, it is possible to realize the basic physical properties of the adhesive layer.

According to one embodiment of the present invention, the carboxyl group-containing monomer may be one selected from the group consisting of (meth)acrylic acid, 2-(meth)acryloyloxyacetic acid, 3-(meth)acryloyloxypropionic acid, 4-(meth)acryloyloxybutyric acid, an acrylic acid dimer, itaconic acid, maleic acid, maleic anhydride, and combinations thereof. As the carboxyl group-containing monomer is selected from those described above, it is possible to realize the basic physical properties of the adhesive layer.

According to one embodiment of the present invention, the nitrogen-containing monomer may be one selected from the group consisting of (meth)acrylonitrile, N-vinyl pyrrolidone, N-vinyl caprolactam, and combinations thereof. As the nitrogen-containing monomer is selected from those described above, it is possible to realize the basic physical properties of the adhesive layer.

According to one embodiment of the present invention, the (meth)acrylate-based resin may further include one selected from the group consisting of vinyl acetate, styrene, acrylonitrile, and combinations thereof. As the (meth)acrylate-based resin further includes vinyl acetate, styrene or acrylonitrile as descried above, other functionalities such as compatibility may be improved.

According to one embodiment of the present invention, the reducing agent may be one selected from the group consisting of a phosphorus-based reducing agent, a sulfur-based reducing agent, a boron-based reducing agent, and combinations thereof. As the reducing agent is selected from those described above, it may mitigate the oxygen inhibition phenomenon by inducing the reduction of a peroxyl radical, thereby preventing the success rate of chip pick-up from decreasing.

According to one embodiment of the present invention, the reducing agent may include one selected from the group consisting of triphenylphosphine, triphenylphosphite, trioctylphosphine, 3,9-bis(octadecyloxy)-2,4,8,10-tetraoxa-3,9-diphosphaspiro[5,5]undecane (BOTDBU), ethylene sulfite (ETS), dimethylamine-borane (Me$_2$NH*BH$_3$), and combinations thereof. As the reducing agent is selected from those described above, it may mitigate the oxygen inhibition phenomenon by inducing the reduction of a peroxyl radical, thereby preventing the success rate of chip pick-up from decreasing.

According to one embodiment of the present invention, the content of the reducing agent in the adhesive composition may be 0.5 parts by weight to 15.0 parts by weight, 1.0 part by weight to 14.0 parts by weight, 2.0 parts by weight to 13.0 parts by weight, 3.0 parts by weight to 12.0 parts by weight, 4.0 parts by weight to 11.0 parts by weight, 5.0 parts by weight to 10.0 parts by weight, 6.0 parts by weight to 9.0 parts by weight, or 7.0 parts by weight to 8.0 parts by weight, based on 100 parts by weight of the adhesive binder. Preferably, the content of the reducing agent may be 3.5 parts by weight to 14.0 parts by weight based on 100 parts by weight of the adhesive binder. As the content of the reducing agent is adjusted within the above-described range, it is possible to mitigate the oxygen inhibition phenomenon by inducing the reduction of a peroxyl radical, thereby preventing the success rate of chip pick-up from decreasing. Furthermore, it is possible to minimize side reactions caused by the addition of an excessive amount of the reducing agent.

According to one embodiment of the present invention, the photoinitiator is not limited to a specific example, and a conventional photoinitiator known in the related art may be used. The amount of photoinitiator used may be determined in consideration of the physical properties and characteristics of the adhesive layer formed and the kind and characteristics of the adhesive binder used. The content of the photoinitiator in the adhesive composition may be 0.1 parts by weight to 20 parts by weight, 1 part by weight to 19 parts by weight, 2 parts by weight to 18 parts by weight, 3 parts by weight to 17 parts by weight, 4 parts by weight to 16 parts by weight, 5 parts by weight to 15 parts by weight, 6 parts by weight to 14 parts by weight, 7 parts by weight to 13 parts by weight, 8 parts by weight to 12 parts by weight, or 9 parts by weight to 11 parts by weight, based on 100 parts by weight of the adhesive binder. Specifically, the content of the photoinitiator is preferably 5.72 parts by weight based on 100 parts by weight of the adhesive binder. In addition, the photoinitiator may include one selected from the group consisting of benzoin and its alkyl ethers, acetophenones, anthraquinones, thioxanthones, ketals, benzophenones, α-aminoacetophenones, acylphosphine oxides, oxime esters, and combinations thereof. As the content of the photoinitiator is adjusted within the above-described range, the adhesive force at the interface between the adhesive layer and a layer adjacent thereto may be improved by increasing the efficiency of radical generation by UV irradiation, and the transfer of unreacted photoinitiator to a layer adjacent to the adhesive layer may be prevented from occurring.

According to one embodiment of the present invention, the adhesive composition for a dicing tape may further include one selected from among a curing agent, a solvent and a mixture thereof. As the adhesive composition for a dicing tape further includes one selected from among a curing agent, a solvent and a mixture thereof as described above, it is possible to control the curing rate of the adhesive composition for a dicing tape while improving the workability of the composition.

According to one embodiment of the present invention, the curing agent may include one or more selected from the group consisting of isocyanate-based compounds, aziridine-based compounds, epoxy-based compounds, and metal chelate-based compounds. As the curing agent is selected from those described above, it is possible to control the curing rate and prevent the physical properties of the adhesive layer from changing.

According to one embodiment of the present invention, the amount of curing agent used may be determined in consideration of the physical properties and characteristics of the adhesive layer formed and the kind and characteristics of the adhesive binder used. For example, the adhesive composition for forming an adhesive layer of a dicing tape according to the above embodiment may include the curing agent in an amount of 0.1 parts by weight to 10 parts by weight, 1 part by weight to 10 parts by weight, 2 parts by weight to 9 parts by weight, 3 parts by weight to 8 parts by weight, or 4 parts by weight to 7 parts by weight, based on 100 parts by weight of the adhesive binder. Specifically, the content of the curing agent is preferably 3.25 parts by weight based on 100 parts by weight of the adhesive binder.

According to one embodiment of the present invention, the solvent may be an organic solvent. The organic solvent may include one or more selected from the group consisting of alcohols, ethers, acetates and ketones. As the solvent is selected from those described above, it is possible to improve the workability of the adhesive composition for a dicing tape.

One embodiment of the present invention provides a dicing tape including: a base film; and an adhesive layer formed at least one surface of the base film, wherein the adhesive layer includes the adhesive composition for a dicing tape.

The dicing tape according to one embodiment of the present invention may prevent the success rate of chip pick-up from decreasing, by including the adhesive composition for a dicing tape in the adhesive layer.

According to one embodiment of the present invention, a plastic film or metal foil known in the art may be used as the base film. Alternatively, the base film may be one polymer film selected from the group consisting of a polyolefin film, a polyester film, a polycarbonate film, a polyvinyl chloride film, a polytetrafluoroethylene film, a polybutene film, a polybutadiene film, a vinyl chloride copolymer film, an ethylene-vinyl acetate copolymer film, an ethylene-propylene copolymer film, and an ethylene-alkyl acrylate copolymer film. For example, the base film may include low-density polyethylene, linear polyethylene, medium-density polyethylene, high-density polyethylene, ultra-low-density polyethylene, a polypropylene random copolymer, a polypropylene block copolymer, homopolypropylene, polymethylpentene, an ethylene-vinyl acetate copolymer, an ethylene-methacrylic acid copolymer, an ethylene-methyl methacrylate copolymer, an ethylene-ionomer copolymer, an ethylene-vinyl alcohol copolymer, polybutene, a styrene copolymer, or a mixture of two or more thereof. Here, the base film including the mixture of two or more polymers is meant to include all films having a structure in which two or more films including the above-described polymers, respectively, are stacked on each other, or single-layer films including two or more of the above-described polymers.

According to one embodiment of the present invention, the base film is generally formed to have a thickness of 10 μm to 200 μm, preferably 50 μm to 180 μm. If the thickness is less than 10 μm, controlling the depth of cutting in the dicing process cannot be stably achieved, and if the thickness is more than 200 µm, a large amount of burrs may occur in the dicing process, or the elongation of the film may decrease, and thus the expanding process may not be performed accurately.

According to one embodiment of the present invention, the base film may be subjected to conventional physical or chemical treatment, such as matting treatment, corona discharge treatment, primer treatment, or crosslinking treatment, if necessary.

According to one embodiment of the present invention, the thickness of the adhesive layer may be 0.5 µm to 50 µm, or 5 µm to 30 µm. As the thickness of the adhesive layer is adjusted within the above-described range, it is possible to adjust the thickness of the dicing tape.

According to one embodiment of the present invention, the contents related to the adhesive composition for a dicing tape included in the adhesive layer include all the contents described above with respect to the embodiment.

According to one embodiment of the present invention, as the dicing tape further includes the reducing agent in the adhesive layer, it is possible to mitigate the oxygen inhibition phenomenon by inducing the reduction of a peroxyl radical. Accordingly, the decrease rate of the adhesive force of the adhesive layer after UV light irradiation relative to the initial adhesive force of the adhesive layer may be 20% to 80%. More specifically, as the dicing tape further includes the reducing agent in the adhesive layer, it is possible to mitigate the oxygen inhibition phenomenon by inducing the reduction of a peroxyl radical, and thus the decrease rate of the adhesive force of the adhesive layer after UV light irradiation under oxygen exposure conditions relative to the initial adhesive force of the adhesive layer may be 20% to 80%.

Hereinafter, the present invention will be described in detail with reference to examples. However, the examples according to the present invention may be modified into various different forms, and the scope of the present invention is not interpreted as being limited to the examples described below. The examples of the present specification are provided to more completely explain the present invention to those skilled in the art.

Examples and Comparative Examples: Production of Die-Bonding Films, Dicing Tapes and Dicing Die-Bonding Films Example 1

(1) Production of Die-Bonding Film

A composition composed of 90 g of a high-molecular-weight acrylic resin (Tg: 20° C.; and weight-average molecular weight: 850,000), 30 g of an epoxy resin (novolac-type epoxy resin; softening point: 94° C.), 20 g of a phenolic resin (phenol novolac resin; softening point: 94° C.) as a curing agent for the epoxy resin, 0.1 g of a medium temperature-initiation curing accelerator (2-methyl-imidazole), 0.5 g of a high temperature-initiation curing accelerator (2-phenyl-4-methyl-imidazole), and 20 g of silica (average particle diameter: 75 nm) as a filler was mixed with methyl ethyl ketone under stirring.

The mixture was applied to a release-treated PET having a thickness of 38 µm, and was dried at 110° C. for 3 minutes, thereby producing a die-bonding film having a coating thickness of 20 µm.

(2) Production of Dicing Tape

An adhesive composition was prepared by adding about 3 g of a TDI-based isocyanate curing agent, about 6 g of a photoinitiator (Irgacure 184) and about 3.5 g of triphenylphosphine (TCI, >95%, MW: 262.29 g/mol) to 100 g of a polymer resin (MW: 700,000) obtained by adding 20 wt % of an acrylate functional group as a side chain to the main chain of an acrylate-based resin.

The adhesive composition was applied to a release-treated PET having a thickness of 38 µm, and was dried at 110° C. for 3 minutes to form an adhesive layer having a thickness of 10 µm. The formed adhesive layer was laminated on a polyolefin base film having a thickness of 90 µm, followed by aging, thereby producing a dicing tape.

(3) Production of Dicing Die-Bonding Film

The die-bonding film cut into a circular shape was transferred onto the produced dicing tape by lamination under a condition of 5 kgf/cm$^2$, thereby producing a dicing die-bonding film.

Example 2

A dicing die-bonding film was produced in the same manner as in Example 1, except that 6.9 g of triphenylphosphine was used in the production of the dicing tape.

Example 3

A dicing die-bonding film was produced in the same manner as in Example 1, except that 13.8 g of triphenylphosphine was used in the production of the dicing tape.

Comparative Example 1

A dicing die-bonding film was produced in the same manner as in Example 1, except that no triphenylphosphine was used in the production of the dicing tape.

Comparative Example 2

A dicing die-bonding film was produced in the same manner as in Example 1, except that 0.35 g of triphenylphosphine was used in the production of the dicing tape.

Comparative Example 3

A dicing die-bonding film was produced in the same manner as in Example 1, except that 20 g of triphenylphosphine was used in the production of the dicing tape.

TEST EXAMPLES

For the dicing die-bonding films of the Examples and the Comparative Examples, the physical properties of each die-bonding film were evaluated, and the results of the evaluation are shown in Table 1 below.

Test Example 1: Measurement of Adhesive Force

The dicing die-bonding films produced in Examples and the Comparative Examples were cut to a width of 25 mm, thereby preparing samples for measuring adhesive force.

For each of the prepared samples, the force (gf/inch) to peel the die-bonding film from the dicing tape at a peeling speed of 300 mm/min and a peeling angle of 180° was measured using a texture analyzer (TA Instrument). According to this method, the initial adhesive force was measured and the adhesive force after irradiating the base surface of the dicing tape with UV light at a dose of 150 mi/cm$^2$ (illumination density: 70 mW/cm$^2$) was measured.

To simulate the oxygen exposure conditions, each of the prepared samples was peeled off, and then the base surface of the dicing tape was irradiated with UV light at a dose of 150 mi/cm² (illumination density: 70 mW/cm²). Then, the dicing tape and the die-bonding film were laminated with each other and the adhesive force between them was measured. The results of the measurement are shown in Table 1 below.

Test Example 2: Measurement of Decrease Rate of Adhesive Force

Based on the initial adhesive force and the adhesive force under oxygen exposure conditions, obtained in Test Example 1, the decrease rate of the adhesive force was calculated. The results of the calculation are shown in Table 1 below.

Test Example 3: Pick-Up Performance

After the release film of the dicing die-bonding film produced in each of the Examples and the Comparative Examples was peeled off, the die-bonding surface was mounted on a mirror wafer (8 inches; 35 μm thickness) at a temperature of 70° C., and then dicing was performed under the conditions described below so that the chip size was 13.3 mm×9.1 mm.

Thereafter, for each diced sample, the base surface of the dicing tape was irradiated with UV light at a dose of 150 mi/cm² (illumination density: 70 mW/cm²), and then the dicing tape was peeled off and laminated again. Following this, expanding was performed using a low-temperature chamber and a heat shrinking device, thereby preparing pick-up measurement samples.

For the prepared samples, chip pick-up was performed using SPA-400 (SHINKAWA) under the conditions described below, and the results are shown in Table 1 below.

Specifically, regarding criteria for evaluation of chip pick-up performance, the needle pin height at which all individual chips were picked up was measured upon evaluation, and evaluation was made according to the following criteria: O: all (100%) the chips were picked up (the die was peeled off from the wafer) at a needle pin height of 0.2 mm or less; and X: the above condition was not satisfied.

-Dicing Conditions-
Instrument: DFD-6361 (DISCO)
Blade type: 27H EBB (DISCO)
Cutting blade height (cut depth): 80 μm
Dicing speed: 15 mm/s
Blade rotational speed: 45,000 rpm -Pick-Up Conditions-
Instrument: SPA-400 (SHINKAWA)
Expanding height: 3.5 mm
Number of needles: 20 pieces
Needle plunge-up height: 0.2 mm
Needle plunge-up speed: 10 mm/s Test Example 4: Measurement of Onset Temperature and Peak Temperature The on-set temperature and peak temperature of the dicing die-bonding film produced in each of the Examples and the Comparative Examples were measured by differential scanning analysis (DSC). Specifically, the dicing die-bonding film produced in each of the Examples and the Comparative Examples was aged in an oven at 60° C. for 3 hours, and then the dicing tape was peeled off. Then, about 5 mg of a sample was taken from the dicing die-bonding film. Then, about 5 mg of the sample was heated using DSC (Differential Scanning calorimeter, DSCQ2000, TA Instrument) within a temperature range of –40° C. to 300° C. at a heating rate of 10° C./min, and the onset temperature, which is the temperature at which the slope at the inflection point between the peak formation temperature and the peak temperature meets the X axis, and the peak temperature, which is the temperature at the maximum of the peak, were measured. The results of measurement of the onset temperature and the peak temperature are shown in Table 1 below.

TABLE 1

| | Example 1 | Example 2 | Example 3 | Comparative Example 1 | Comparative Example 2 | Comparative Example 3 |
| --- | --- | --- | --- | --- | --- | --- |
| Initial adhesive force (gf/inch) | 486 | 485 | 487 | 487 | 482 | 485 |
| Adhesive strength (gf/inch) after UV irradiation | 10.8 | 10.2 | 11.1 | 11.3 | 10.9 | 11.6 |
| Adhesive force (gf/inch) after UV irradiation under oxygen exposure conditions | 362 | 351 | 341 | 470 | 391 | 392 |
| Decrease rate (%) of adhesive force | 26 | 28 | 30 | 3 | 19 | 19 |
| Pick-up performance | O | O | O | X | X | O |
| Onset temperature (° C.) | 165 | 162 | 152 | 163 | 163 | 145 |
| Peak temperature (° C.) | 221 | 219 | 194 | 221 | 221 | 180 |

As shown in Table 1 above, it can be seen that the decrease rate of the adhesive force of each of Examples 1 to 3 after UV irradiation under oxygen exposure conditions was significantly higher than that of Comparative Example 1. This suggests that, because the reducing agent was further included in the adhesive layer, the reducing agent improved the pick-up performance by mitigating the oxygen inhibition phenomenon.

When comparing Examples 1 to 3 with Comparative Examples 2 and 3, it could be confirmed that, because Comparative Example 2 did not include a sufficient amount of the reducing agent in the adhesive layer, the decrease rate of the adhesive force of Comparative Example 2 after UV irradiation under oxygen exposure conditions was significantly low. Furthermore, it could be confirmed that, because Comparative Example 3 included an excessive amount of the reducing agent in the adhesive layer, the onset temperature and peak temperature of Comparative Example 3 were lower than those of Examples 1 to 3.

In addition, it could be confirmed that, because Comparative Example 3 included an excessive amount of the reducing agent in the adhesive layer, it had a problem of causing side reactions, the onset temperature thereof was low, and the peak temperature thereof was also low. From this, it can be expected that when a dicing die-bonding film includes an excessive amount of the reducing agent, like Comparative Example 3, the dicing die-bonding film is likely to be exposed to a problem that may cause side reactions, and the die-bonding film is vulnerable to time-dependent changes.

Therefore, when the reducing agent is included in the adhesive layer in an amount of 0.5 parts by weight to 15 parts by weight, the reducing agent may mitigate the oxygen inhibition phenomenon, and may minimize time-dependent changes or side reactions in the die-bonding film layer during and after lamination of the dicing die-bonding film.

As described above, as the adhesive composition for a dicing tape according to one embodiment of the present invention further includes the reducing agent, it may mitigate the oxygen inhibition phenomenon by inducing the reduction of a peroxyl radical.

In addition, as the dicing tape according to one embodiment of the present invention includes the adhesive composition for a dicing tape in the adhesive layer thereof, it may prevent the success rate of chip pick-up from decreasing.

The effects of the present invention are not limited to the above-mentioned effects, and effects which are not mentioned will be clearly understood by those skilled in the art from the present specification.

Although the present invention has been described above with respect to the limited embodiments, the present invention is not limited to these embodiments. Those skilled in the art will appreciate that various modifications and variations are possible without departing from the technical spirit of the present invention and the appended claims and equivalents thereto.

What is claimed is:

1. An adhesive composition for a dicing tape comprising: an adhesive binder; a reducing agent; and a photoinitiator,
wherein the adhesive binder comprises a (meth)acrylate-based resin,
wherein the reducing agent is comprised in an amount of 3.5 parts by weight to 15.0 parts by weight based on 100 parts by weight of the adhesive binder, and improves pickup degradation of a semiconductor chip by inducing reduction of a peroxyl radical, and
wherein the reducing agent is one selected from the group consisting of triphenylphosphine, trioctylphosphine, 3,9-bis(octadecyloxy)-2,4,8,10-tetraoxa-3,9-diphosphaspiro[5,5]undecane (BOTDBU), ethylene sulfite (ETS), dimethylamine-borane (Me$_2$NH*BH$_3$), and combinations thereof.

2. The adhesive composition of claim 1, wherein the (meth)acrylate-based resin has a glass transition temperature of −28° C. to −58° C.

3. The adhesive composition of claim 2, wherein the (meth)acrylate-based resin comprises a copolymer of a (meth)acrylic ester-based monomer and a crosslinkable functional group-containing monomer.

4. The adhesive composition of claim 1, wherein the photoinitiator is one selected from the group consisting of benzoin and its alkyl ethers, acetophenones, anthraquinones, thioxanthones, ketals, benzophenones, α-aminoacetophenones, acylphosphine oxides, oxime esters, and combinations thereof.

5. The adhesive composition of claim 1, wherein the adhesive composition further comprises one selected from among a curing agent, a solvent, and a mixture thereof.

6. A dicing tape comprising: a base film; and an adhesive layer provided on at least one surface of the base film,
wherein the adhesive layer comprises the adhesive composition for a dicing tape according to claim 1.

7. The dicing tape of claim 6, wherein a decrease rate of an adhesive force of the adhesive layer after UV irradiation under oxygen exposure conditions relative to an initial adhesive force of the adhesive layer is 20% to 80%.

8. The dicing tape of claim 6, wherein the base film is one polymer film selected from the group consisting of a polyolefin film, a polyester film, a polycarbonate film, a polyvinyl chloride film, a polytetrafluoroethylene film, a polybutene film, a polybutadiene film, a vinyl chloride copolymer film, an ethylene-vinyl acetate copolymer film, an ethylene-propylene copolymer film, and an ethylene-alkyl acrylate copolymer film.

9. The adhesive composition of claim 3, wherein the (meth)acrylic ester based monomer is at least one selected from the group consisting of pentyl(meth)acrylate, n-butyl (meth)acrylate, ethyl(meth)acrylate, methyl(meth)acrylate, hexyl(meth)acrylate, n-octyl(meth)acrylate, isooctyl(meth) acrylate, 2-ethylhexyl(meth)acrylate, dodecyl(meth)acrylate, and decyl(meth)acrylate.

10. The adhesive composition of claim 3, wherein the crosslinkable functional group-containing monomer is at least one monomer selected from the group consisting of a hydroxyl group-containing monomer, a carboxyl group-containing monomer and a nitrogen-containing monomer.

11. An adhesive composition for a dicing tape comprising: an adhesive binder; a reducing agent; and a photoinitiator,
wherein the reducing agent is comprised in an amount of 3.5 parts by weight to 15.0 parts by weight based on 100 parts by weight of the adhesive binder,
wherein the reducing agent improves pickup degradation of a semiconductor chip by inducing reduction of a peroxyl radical, and
wherein the reducing agent is one selected from the group consisting of a sulfur-based reducing agent, a boron-based reducing agent, and combinations thereof.

12. The adhesive composition of claim 11, wherein the adhesive binder comprises a (meth)acrylate-based resin having a glass transition temperature of −28° C. to −58° C.

13. The adhesive composition of claim 12, wherein the (meth)acrylate-based resin comprises a copolymer of a (meth)acrylic ester-based monomer and a crosslinkable functional group-containing monomer.

14. The adhesive composition of claim 11, wherein the photoinitiator is one selected from the group consisting of benzoin and its alkyl ethers, acetophenones, anthraquinones, thioxanthones, ketals, benzophenones, α-aminoacetophenones, acylphosphine oxides, oxime esters, and combinations thereof.

15. The adhesive composition of claim 11, wherein the adhesive composition further comprises one selected from among a curing agent, a solvent, and a mixture thereof.

16. A dicing tape comprising: a base film; and an adhesive layer provided on at least one surface of the base film,
wherein the adhesive layer comprises the adhesive composition for a dicing tape according to claim 11.

17. The dicing tape of claim 16, wherein a decrease rate of an adhesive force of the adhesive layer after UV irradiation under oxygen exposure conditions relative to an initial adhesive force of the adhesive layer is 20% to 80%.

18. The dicing tape of claim 16, wherein the base film is one polymer film selected from the group consisting of a polyolefin film, a polyester film, a polycarbonate film, a polyvinyl chloride film, a polytetrafluoroethylene film, a polybutene film, a polybutadiene film, a vinyl chloride copolymer film, an ethylene-vinyl acetate copolymer film, an ethylene-propylene copolymer film, and an ethylene-alkyl acrylate copolymer film.

19. The adhesive composition of claim 13, wherein the (meth)acrylic ester based monomer is at least one selected from the group consisting of pentyl(meth)acrylate, n-butyl (meth)acrylate, ethyl(meth)acrylate, methyl(meth)acrylate, hexyl(meth)acrylate, n-octyl(meth)acrylate, isooctyl(meth) acrylate, 2-ethylhexyl(meth)acrylate, dodecyl(meth)acrylate, and decyl(meth)acrylate.

20. The adhesive composition of claim 13, wherein the crosslinkable functional group-containing monomer is at least one monomer selected from the group consisting of a hydroxyl group-containing monomer, a carboxyl group-containing monomer and a nitrogen-containing monomer.

\* \* \* \* \*